(12) United States Patent
Nakai et al.

(10) Patent No.: US 6,903,395 B2
(45) Date of Patent: Jun. 7, 2005

(54) SEMICONDUCTOR DEVICE INCLUDING INTERLAYER LENS

(75) Inventors: Junichi Nakai, Fukuyama (JP); Fujio Agoh, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/358,673

(22) Filed: Feb. 5, 2003

(65) Prior Publication Data

US 2003/0168679 A1 Sep. 11, 2003

(30) Foreign Application Priority Data

Feb. 5, 2002 (JP) ........................................ 2002-028436

(51) Int. Cl.[7] .............................................. H01L 31/00
(52) U.S. Cl. ...................... 257/294; 257/291; 257/292; 257/461; 257/462; 257/258; 257/257
(58) Field of Search ................................. 257/291, 292, 257/294, 290, 461, 462, 258, 257, 432, 59, 82, 98, 72

(56) References Cited

U.S. PATENT DOCUMENTS

| | | | |
|---|---|---|---|
| 5,371,397 A | 12/1994 | Maegawa et al. | |
| 5,877,040 A | 3/1999 | Park et al. | |
| 6,030,852 A | 2/2000 | Sano et al. | |
| 6,188,094 B1 | 2/2001 | Kochi et al. | |
| 6,313,467 B1 | * 11/2001 | Shafer et al. | ................ 250/372 |

FOREIGN PATENT DOCUMENTS

| | | |
|---|---|---|
| JP | 60-262458 | 12/1985 |
| JP | 1-309370 | 12/1989 |
| JP | 3-190168 | 8/1991 |
| JP | 3-238863 | 10/1991 |
| JP | 03-238863 | * 10/1991 |
| JP | 04-012568 | 1/1992 |
| JP | 11-40787 | 2/1999 |
| JP | 11040787 | 2/1999 |

* cited by examiner

*Primary Examiner*—Minhloan Tran
*Assistant Examiner*—Tan Tran
(74) *Attorney, Agent, or Firm*—David G. Conlin; George W. Neuner; Edwards & Angell LLP

(57) ABSTRACT

A semiconductor device including an overcoat layer of a transparent material disposed on a substrate, a projection formed on the overcoat layer, a convex intralayer lens of an inorganic material formed to include the projection as a core and a transparent film with a flat top surface formed on the convex intralayer lens.

8 Claims, 5 Drawing Sheets

SEMICONDUCTOR DEVICE INCLUDING INTERLAYER LENS

CROSS-REFERENCE TO RELATED APPLICATION

This application is related to Japanese Patent Application No. 2002-28436 filed on Feb. 5, 2002, whose priority is claimed under 35 USC § 119, the disclosure of which is incorporated by reference in its entirety.

BACKGROUND OF THE INVENTION

1. Field of the Invention

The present invention relates to a semiconductor device and a method of manufacturing the same. More specifically, it relates to a semiconductor device including an intralayer lens which is suitably used in solid image pickup devices such as CCDs (charge-coupled devices) and liquid crystal display devices, and a method of manufacturing the same.

2. Description of Related Art

Solid image pickup devices of CCD or MOS (metal oxide semiconductor) type have been used in various applications such as digital cameras, video cameras, cellular phones equipped with cameras, scanners, digital copiers, facsimiles and the like. As the application becomes wider, there are increasing demands for higher performance and function such as increase in pixel number and improvement in light receiving sensitivity, as well as reduction in size and cost.

As the size reduction and the pixel number increase progress in the solid image pickup device, the size of pixels installed in the solid image pickup device becomes smaller. This decreases the light receiving sensitivity, which is a fundamental performance, and may possibly cause difficulty in clear imaging under a certain light level.

To deal with such a problem, was adopted a technique of forming a microlens of an organic polymer material on a color filter to increase the light receiving sensitivity. However, this is no longer sufficient to achieve a satisfactory effect (for example, see Japanese Unexamined Patent Publication No. HEI 4 (1992)-12568). Accordingly, a technique of forming a lens within a layered structure, i.e., a so-called intralayer lens disposed between a color filter and a light receiving part below the color filter, has been adopted in combination with the microlens technique.

FIG. 1 shows a schematic sectional view of a single pixel (unit cell) of a CCD solid image pickup device including a prior art intralayer lens (see Japanese Unexamined Patent Publication No. HEI 11 (1999)-40787). FIGS. 2(a) to 2(e) illustrate an example of a method of manufacturing the prior art intralayer lens of FIG. 1.

First, as shown in FIG. 2(a), a semiconductor substrate 1 is subjected to ion implantation of required impurities to form a light receiving part 2, a read-out gate 3, a CCD transfer channel (transfer part) 4 and a channel stopper 5. Then, a transfer electrode 7 of a predetermined pattern is formed on the surface with the intervention of an insulating film 6 and a light shield film 9 covering the transfer electrode 7 is formed with the intervention of an interlayer insulating film 8. The light shield film 9 is patterned to have an opening positioned above the light receiving part 2.

Then, referring to FIG. 2(b), a film formed by reflowing such as a BPSG (boro-phosphosilicate glass) film or a film formed by plasma CVD (chemical vapor deposition) is provided on the light shield film 9 to form a first flattening film 10 to flatten the surface.

On the first flattening film 10, a material layer 16 for forming an intralayer lens 11 having a high refractive index (e.g., a silicon nitride film) is formed by plasma CVD as shown in FIG. 2(c).

Then, as shown in FIG. 2(d), a photoresist 17 is applied onto the lens material layer 16 and patterned into the shape of a desired intralayer lens 11, followed by reflowing at about 160° C.

Then, referring to FIG. 2(e), the lens shape of the photoresist 17 is transferred to the lens material layer 16 by dry etching to form the intralayer lens 11.

Thereafter, a second flattening layer 12 (not shown) covering the intralayer lens 11 is formed to flatten the surface. Then, a color filter 13, a protective film 14 and a microlens 15, which are not shown, are formed in sequence. Thereby, the CCD solid image pickup device shown in FIG. 1 is obtained.

In the above-described step of transferring the intralayer lens by dry etching using the lens-shaped resist as a mask, however, the following problems are caused.

First, upon forming the resist into the lens shape, the resist is generally heated to about 160° C. on a hot plate for transformation until its surface tension and interface energy with respect to the underlying intralayer lens material layer reach a state of equilibrium. If gaps between adjacent patterned resists are filled to connect the resists upon fusing under heating, the transformation of the resist continues until a stable shape is obtained. This makes difficult to obtain a predetermined lens shape.

Second, upon dry etching using the lens-shaped resist as a mask, it is difficult to obtain the intralayer lenses of uniform shape due to nonuniformity in lens shape of the resist and variation in etching speed. Further, because of the limited etching selectivity between the resist and the intralayer lens material layer, the choice of materials is limited.

SUMMARY OF THE INVENTION

Under these circumstances, the present invention provides a semiconductor device comprising an overcoat layer of a transparent material disposed on a substrate, a projection formed on the overcoat layer, a convex intralayer lens of an inorganic material formed to include the projection as a core and a transparent film with a flat top surface formed on the convex intralayer lens.

Further, the present invention provides a method of manufacturing a semiconductor device comprising the steps of: forming an overcoat layer of a transparent material on a substrate; depositing a thin film for forming a projection on the overcoat layer; leaving the thin film to form a columnar projection; depositing an inorganic material on the surface of the substrate provided with the projection such that the material includes the projection as a core to form a convex interlayer lens; and forming a transparent film with a flat top surface on the intralayer lens.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
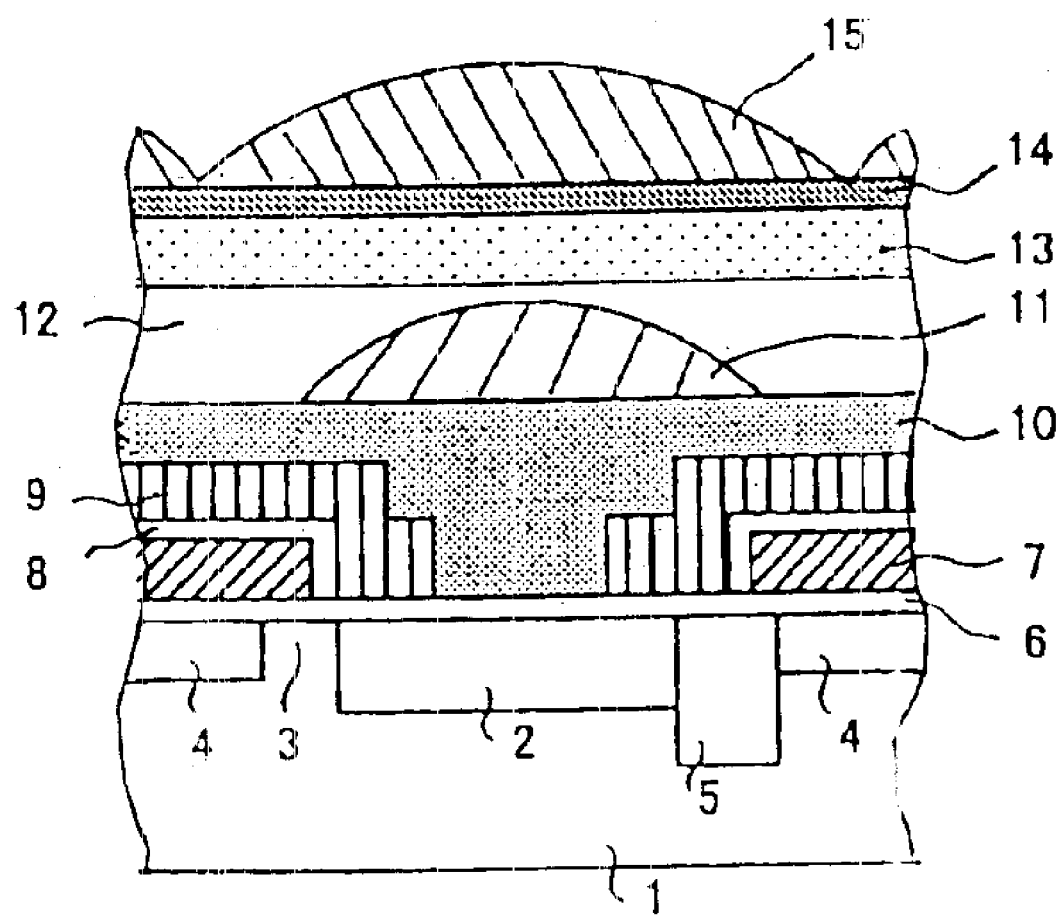
FIG. 1 is a schematic sectional view corresponding to a single pixel of a solid image pickup device including a prior art intralayer lens.
Figure 2A:
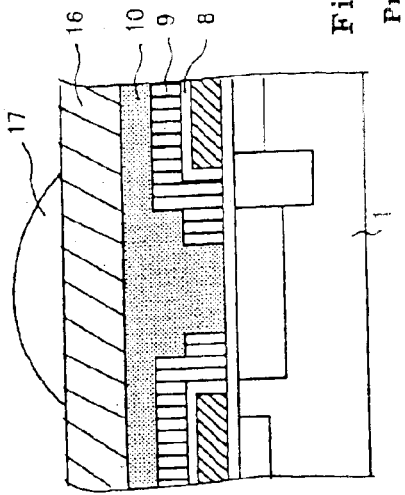
FIGS. 2(a) to 2(e) are views illustrating the steps of manufacturing the solid image pickup device including the prior art intralayer lens.
Figure 2D:
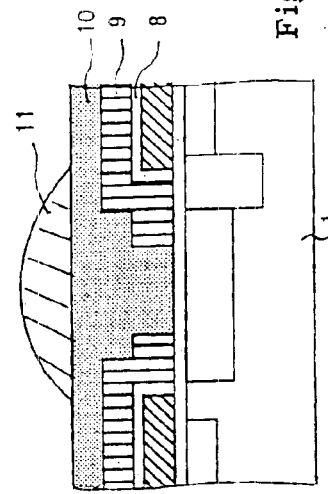
Figure 2B:
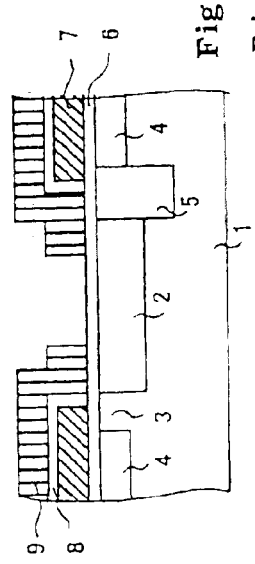
Figure 2E:
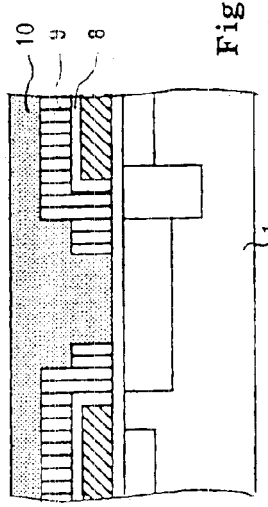
Figure 2C:
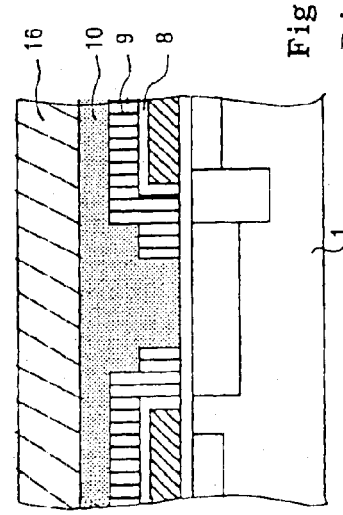

The substrate used in the present invention is not particularly limited as long as it is generally used for forming semiconductor devices. For example, semiconductor substrates made of silicon and germanium and compound semiconductor substrates made of SiC, SiGe, GaAs and AlGaAs may be used. Among them, a silicon substrate is preferable. The substrate may be doped with n- or p-type impurities. Further, one or more n- or p-type well may be formed therein.

The substrate may be provided with a light receiving or emitting part. Examples of the light receiving or emitting part include light receiving elements used in so-called solid image pickup devices such as CCD and CMOS image sensors, CMDs, charge injection devices, bipolar image sensors, photoconductive film image sensors, stacked-type CCDs and infrared image sensors, as well as all of those used as the light receiving or emitting part in various devices, e.g., light emitting devices such as light emitting diodes and light transmission control devices such as liquid crystal panels.

The light receiving or emitting part, in particular as the light receiving part, may typically be a pn junction diode formed on the surface of the semiconductor substrate. In this case, the size, shape, number and impurity concentration of a p- or n-type impurity layer formed on the surface of the semiconductor substrate may suitably be selected depending on the performance of the intended semiconductor device.

In the case where plural light receiving or emitting parts are formed, adjacent light receiving or emitting parts may have a suitable interval of about 2 to 10 $\mu$m.

The light receiving or emitting part may be formed by a known method, for example, ion implantation using a mask formed by photolithography and etching to have an opening in a desired region.

On the substrate surface, may be formed in addition to the light receiving or emitting part, a region containing high concentration p- or n-type impurities which functions as a CCD transfer channel, a charge transfer region, an isolation region, a contact region, a channel stopper region and the like. Further, other semiconductor devices and circuits may be formed in combination.

On the substrate, films having various functions may be formed as a single-layer or multilayer film. More specifically, such films are an insulating film, a transfer electrode, an interlayer insulating film and a light shield film. Examples of the insulating film include a silicon oxide film of about 10 to 1,000 nm thick formed by CVD, a plasma TEOS (tetra-ethoxy silane) film formed by CVD, an LTO (low temperature oxide) film, an HTO (high temperature oxide) film, an NSG film (none-doped silicate glass) film, an SOG (spin on glass) film formed by spin coating and a silicon nitride film formed by CVD, which are of a single-layer or multilayer structure. The transfer electrode may be made of polycrystalline silicon or tungsten silicide. The light shield film may be made of tungsten silicide or TiW.

On the substrate on which the above-described components have been optionally formed, an overcoat layer of a transparent material is formed. The overcoat layer also has a function of flattening the substrate surface. Accordingly, there is no particular limitation to the thickness and material of the overcoat layer as long as it carries out the function and has transparency. For example, a film formed by reflowing (e.g., a BPSG film) and a film formed by plasma CVD may be used.

On the overcoat layer, projections are formed. The intralayer lens of the present invention is formed after the formation of the projections by depositing an intralayer lens material on the overcoat layer at a predetermined position such that the material is deposited around each projection which functions as a core to have an almost hemispherical shape. The size of the intralayer lens is controlled by the shape of the projection, the deposit thickness of the intralayer lens material and the deposition conditions. In the case where the deposition conditions are optimally selected and the deposition speed is set equal in every direction, gaps between adjacent intralayer lenses are filled to connect the lenses. Even if the deposition is continued further, the intralayer lenses can maintain the lens shape, respectively. Therefore, according to the present invention, there is no need of maintaining the gaps between the intralayer lenses, which allows easy miniaturization of the semiconductor device.

The projection is preferably formed above almost the center of the light receiving or emitting part. The size, height, shape and material of the projection are not particularly limited and may be selected depending on the pixel number of the semiconductor device. For example, the projection may be in the shape of a column, prism, truncated cone, truncated pyramid, hemisphere, semioval and the like having the size of about 0.1 to 1×0.1 to 1 $\mu$m width (or about 0.01 to 1 $\mu m^2$) and a height of about 0.4 to 4 $\mu$m. Material for the projection is not particularly limited and any material may be used as long as it is a film generally used in the manufacture of the semiconductor devices. For example, conductive materials generally used for an electrode of the semiconductor device (silicon such as polycrystalline silicon, monocrystalline silicon and amorphous silicon or other semiconductors; transparent conductive films of ITO, ZnO and $SnO_2$; metals or alloys such as aluminum, copper, platinum, silver, zinc, Al—Si and Al—Cu; refractory metals or alloys such as tungsten, tantalum, titanium, molybdenum and TiW; silicides of these metals; and polycides) and insulating films described above. If the projection material is translucent as the ITO film, it is preferable because incident or emitted light is not blocked by the projection and loss of light reception or emission becomes almost negligible. The films for forming the projection may have a single-layer or multilayer structure.

The projections are preferably located at the center of pixels. Usually one projection is situated in each of the pixels. Generally the pixels are each square or hexagonal as seen in plan and adjoin each other to form an array.

A semiconductor device according to the present invention is provided with a convex intralayer lens of an inorganic material formed to include the projection as a core. The intralayer lens is suitably made of an inorganic material which is translucent to visible rays and/or infrared rays. Here, being translucent signifies that the material shows the transmittance of the visible rays or the infrared rays of about 50% or more. Examples of such a material include, though it depends on the thickness, silicon oxide, silicon nitride, silicon oxide nitride and a laminate of them. Thickness of the intralayer lens made of these materials may suitably be adjusted depending on the size and the height of the projection. For example, the thickness is about 0.4 to 4 μm.

The intralayer lens preferably has a convex shape corresponding to the projection disposed above almost the center of the light receiving or emitting part. The convex shape corresponding to the projection signifies that the intralayer lens material film deposited on the entire surface of the substrate provided with the projections rises up to the convex shape due to the existence of the projections. Adjacent intralayer lenses may be connected by controlling the interval between the projections and the thickness of the intralayer lens material film, as long as each intralayer lens maintains the convex shape derived from the projection.

To form the projections, first, a thin film for forming the projections is formed on the entire surface of the substrate. The above-described materials may suitably be used as the thin film for forming the projections. The thin film is preferably formed on the entire surface of the substrate. The method for forming the thin film is suitably selected from those known in the art such as sputtering, various CVD methods such as reduced pressure CVD, atmospheric pressure CVD and plasma CVD, spin coating, vacuum vapor deposition and EB method. Then, the projections are formed by removing the thin film to leave it only on the predetermined regions. This removal may be performed by a known method such as photolithography and etching so that the projections have a desired shape. Then, on the entire surface of the substrate provided with the projections, the intralayer lens material film is deposited. The above-described materials may be used as the intralayer lens material film. This film may be formed by a known method such as sputtering or CVD. Thus, the convex intralayer lens corresponding to the projection is formed.

On the intralayer lens, a transparent film with a flat top surface is formed. Any material may be used as the transparent film as long as it protects the intralayer lens from mechanical failure and has translucency to visible rays and/or infrared rays. In particular, it is preferred that the transparent film has a refractive index smaller than that of the intralayer lens. More specifically, the refractive index of the transparent film is smaller than that of the intralayer lens by about 5% or more. For example, a fluorine-containing resin film and a perfluorocarbon film may be used as the transparent film.

Further, a microlens may be formed on the transparent film. Thereby, larger amount of incident or emitted light can be gathered. Material for the microlens is not particularly limited and those known in the art may be used. For example, transparent resins such as polystyrene and novolac resin may be used. It is preferred that a center line of the microlens vertical to the substrate is collinear with that of the underlying convex intralayer lens.

A color filter layer may be disposed at a predetermined position between the transparent film and the microlens. The color filter layer allows providing a semiconductor device ready for full color operation. The color filter layer is formed by, for example, applying a photoresist containing a desired coloring agent (pigment, dye) onto the transparent film, followed by light exposure and development. The color filter layer may be provided with a protective film formed thereon.

Hereinafter, an embodiment of the present invention is detailed with reference to the figures. The following explanation is given of the steps of manufacturing a CCD solid image pickup device. Materials and devices appear in the following description are substantially the same as those generally used in the manufacture of the semiconductor devices and hence detailed explanation thereof is omitted with exceptions to particular cases. The manufacture process is described below step by step.

Figure 3A:
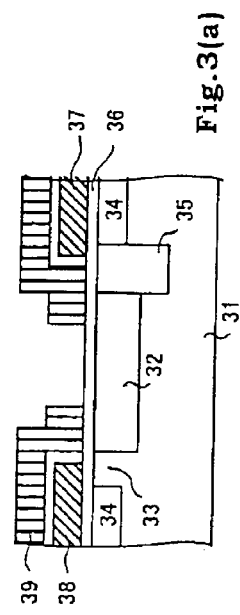
FIGS. 3(a) to 3(f) are views illustrating the steps of manufacturing a solid image pickup device according to the present invention.

First, as shown in FIG. 3(a), a semiconductor substrate 31 is subjected to ion implantation of required impurities to form a light receiving part 32, a read-out gate 33, a CCD transfer channel (transfer part) 34 and a channel stopper 35. Then, a transfer electrode 37 of a predetermined pattern is formed on the surface with the intervention of an insulating film 36 and a light shield film 39 covering the transfer electrode 37 is formed with the intervention of an interlayer insulating film 38. The light shield film 39 is patterned to have an opening above the light receiving part 32.

Figure 3B:
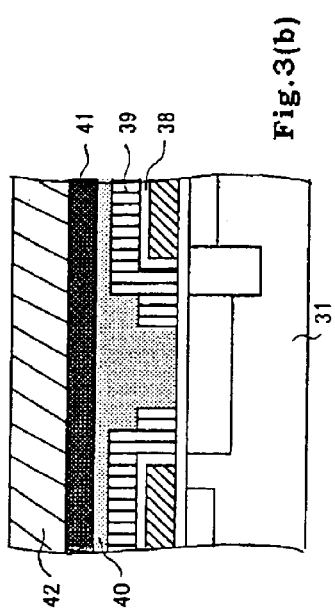

Then, referring to FIG. 3(b), a film formed by reflowing such as a BPSG film or a film formed by plasma CVD is provided on the light shield film 39 to form an overcoat layer 40. Further, a thin metal film 41 of Al for forming wiring on the periphery of the solid image pickup device is deposited to 0.4 μm thick by sputtering and then a photoresist 42 is applied to the entire surface.

Figure 3C:
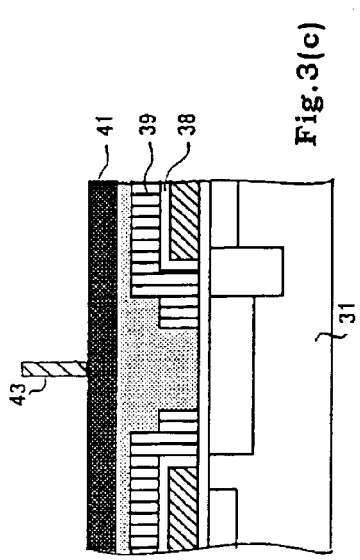

Subsequently, the photoresist 42 on the thin metal film is subjected to photolithography such that it is left only at predetermined positions with a predetermined size, thereby obtaining a mask 43 for patterning the thin metal film 41. The predetermined positions where the photoresist is left to serve as the etching mask is a region for forming the wiring and a region above the light receiving part shown in FIG. 3(c), which are patterned at the same time.

Then, using the mask 43 formed of the photoresist, the thin metal film is removed by a known etching technique to leave the thin metal film below the mask 43. Then, the photoresist used as the mask is removed by a known method.

Figure 3D:
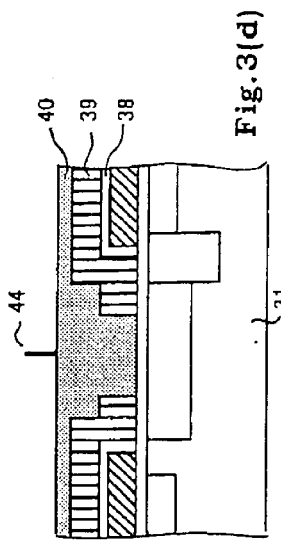

Thereby, metal wiring is formed on the surface of the semiconductor substrate, though it is not shown in the figures. As shown in FIG. 3(d), a projection 44 of a predetermined size is provided above the light receiving part. The projection 44 has a columnar shape having a diameter of 0.1 μm. The interval between each projection is 3.0 μm.

Figure 3E:
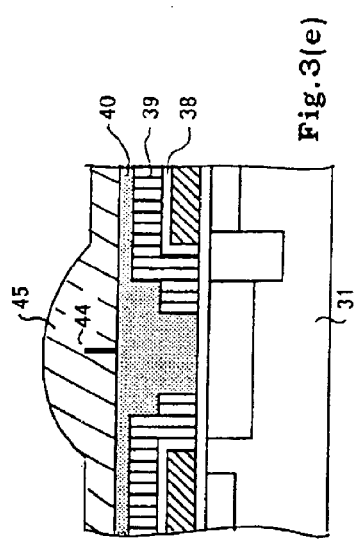

Then, a silicon nitride film is deposited to 0.6 μm thick on the entire surface of the substrate heated at 400° C. using a mixture gas of monosilane ($SiH_4$), ammonia ($NH_4$) and nitrogen ($N_2$) in a vessel wherein gas pressure is maintained at 600 Pa by plasma CVD. Thereby, on the metal wiring, an overcoat layer is formed and at the same time, an intralayer lens 45 including the projection 44 as a core is formed above the light receiving part as shown in FIG. 3(e). The overcoat layer may be made of any material as long as it protects the solid image pickup device from mechanical failure and has translucency to visible rays and/or infrared rays. In this embodiment, the intralayer lens has a hemispherical shape having a diameter of about 1.2 μm.

Figure 3F:
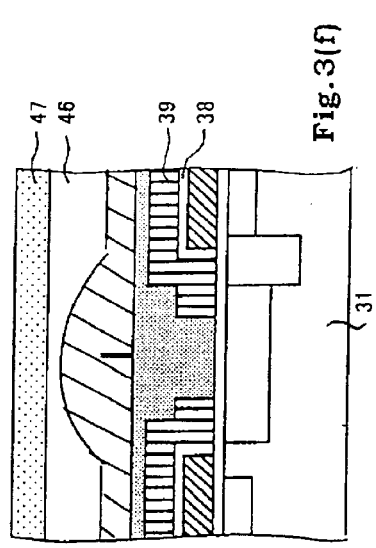

Thereafter, as shown in FIG. 3(f), a transparent film 46 of 1.0 μm thick (e.g., fluoric resin) having a refractive index smaller than that of the intralayer lens is formed to cover the intralayer lens 45 and the surface thereof is flattened. Then, negative resists containing dispersed pigments of green, red and blue, respectively, are applied, exposed to light and developed, followed by patterning into desired configuration by the photolithography technique generally used in the semiconductor process. Thereby, a color filter 47 is obtained.

Figure 4:
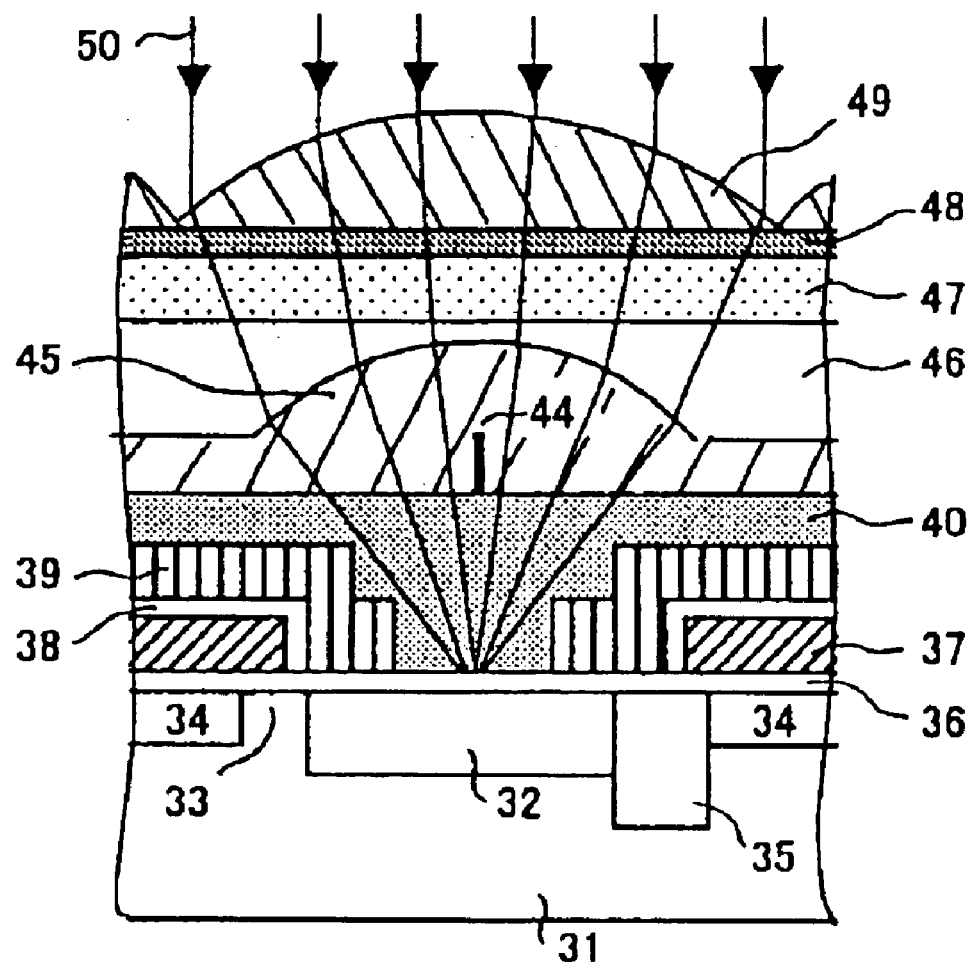
FIG. 4 is a schematic sectional view corresponding to a single pixel of the solid image pickup device according to the present invention.

On the color filter 47, thermosetting acryl resin (e.g., Optomer SS-1151 manufactured by JSR) is applied to 0.6 μm thick to form a protective film 48 and then a microlens 49 is formed by a known method (e.g., see the above-cited Japanese Unexamined Patent Publication No. HEI 4 (1992)-12568). Thereby, a CCD solid image pickup device shown in FIG. 4 is obtained. The amount of incident light blocked by the projection above the light receiving part is about 1.5% of the total incident light amount.

FIG. 4 shows an example of a CCD image pickup device wherein the formation of the microlens is completed. Reference numerals 45 and 44 indicate the intralayer lens and the projection, respectively. In FIG. 4, components which are not directly related to the present invention are omitted. Reference numeral 50 signifies incident light entering the CCD image pickup device. The light gathering effect of the intralayer lens 45 improved the sensitivity by about 15%.

Figures 5A, 5B:
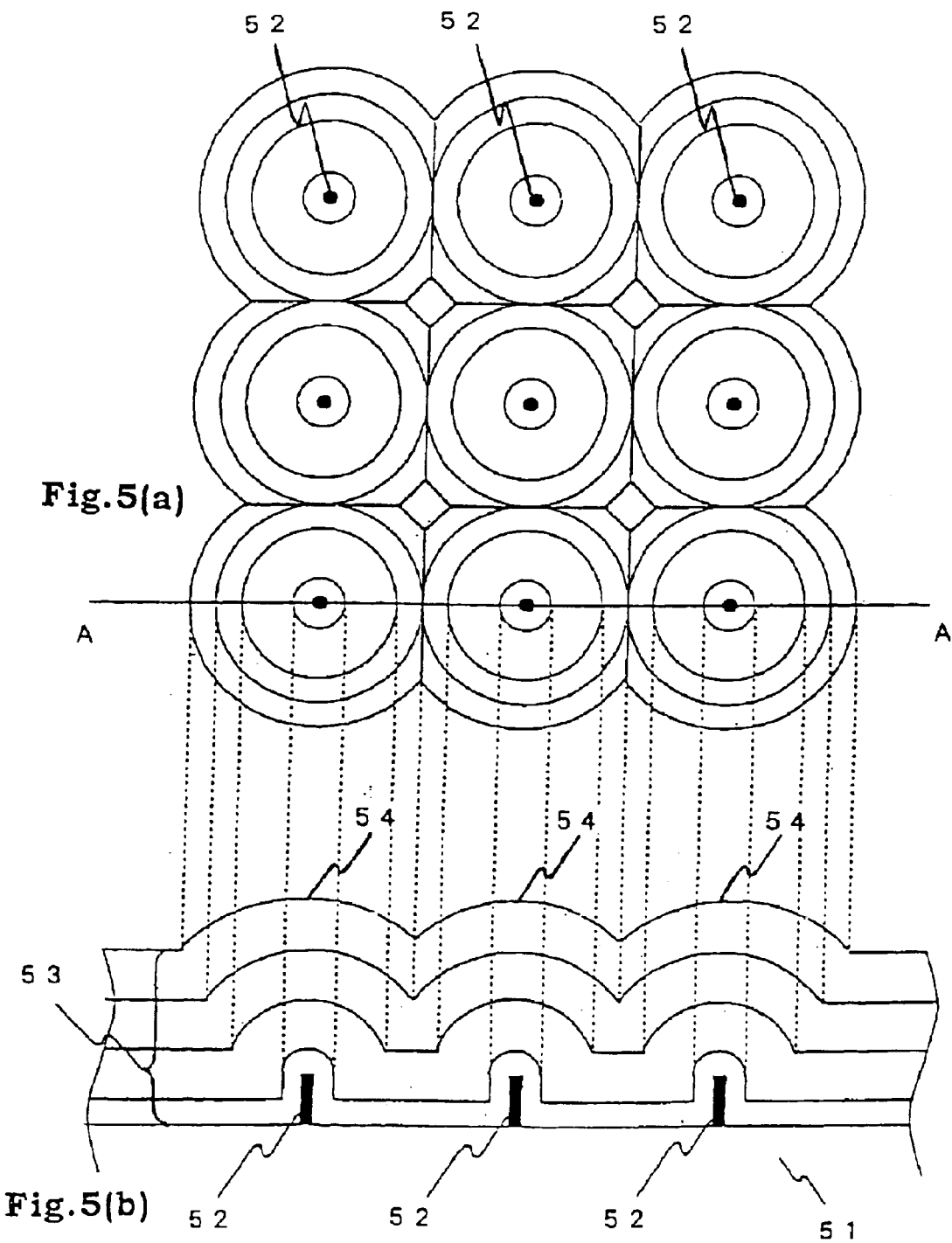
FIGS. 5(a) and 5(b) are diagrams illustrating the process of forming the intralayer lens by plasma CVD according to the present invention.

FIGS. 5(a) and 5(b) are diagrams illustrating the step of forming the intralayer lens by plasma CVD. In these figures, reference numeral 51 signifies the overcoat layer, 52 the projections, 53 the intralayer lens material film and 54 the intralayer lenses. Progress of the deposition of the intralayer lens material film 53 is described by lines. FIG. 5(a) is a plan view of the intralayer lenses viewed from above and FIG. 5(b) is a sectional view taken along the line A–A' of FIG. 5(a).

Upon plasma CVD for forming the intralayer lenses, gas molecules are solidified by chemical reaction to deposit on the solid surface if the optimum conditions are selected. Accordingly, even if the deposition is further continued after the gaps between adjacent intralayer lenses are filled to connect the lenses, each intralayer lens can maintain the lens shape. Therefore, there is no need of maintaining the gaps between the adjacent intralayer lenses.

The above-described embodiment is described in connection with the CCD solid image pickup device. However, the intralayer lens of the present invention and the method of manufacturing the same are also applicable to other solid image pickup devices such as MOS solid image pickup devices and liquid crystal display devices. Even in such cases, the shape of the projections, the deposition thickness of the intralayer lens material film and the deposition conditions are adjusted to obtain the intralayer lens of a desired shape. Accordingly, by applying the present invention to each device described above, the shape and the focus length of the intralayer lens are adjusted to optimize the device characteristics.

The intralayer lens of the present invention and the method of manufacturing the same are not limited to the above-described embodiment and various arrangements can be done without departing from the spirit of the present invention.

As apparent from the above, the intralayer lens of the present invention is formed to include the projection as a core. Therefore, loss of light reception caused by maintaining the gaps between the intralayer lenses does not increase even if the device is miniaturized. Thus, the intralayer lens of the present invention is excellent for miniaturization. Further, since the metal wiring and the projections are formed at the same time and the overcoat layer and the intralayer lens are formed at the same time by CVD, special facilities are not required and the manufacturing steps are simplified.

Further, according to the present invention, the thickness of the intralayer lens is adjusted by suitably selecting the shape of the projection, the deposition thickness of the intralayer lens material and the deposition conditions. Thereby, the focus length range of the incident light is widened. That is, the focus length of the intralayer lens can be adjusted to a desired level within the wide range. Therefore, improvement in sensitivity is achieved in the solid image pickup devices of various unit cell sizes. Further, in the liquid crystal display devices, optimum characteristics are obtained by widely adjusting the shape and the focus length of the intralayer lens.

What is claimed is:

1. A semiconductor device comprising an overcoat layer of a transparent material disposed on a substrate, a projection formed as a physical element on the overcoat layer, a convex intralayer lens of an inorganic material formed to include the projection as a core and a transparent film with a flat top surface formed on the convex intralayer lens, wherein the projection has a size of 0.1 to 1×0.1 to 1 μm in width and is 0.4 to 4 μm in height.

2. The semiconductor device according to claim 1, wherein the substrate is provided with a light receiving or emitting part and the projection is disposed above the center of the light receiving or emitting part.

3. The semiconductor device according to claim 1, wherein the transparent film has a refractive index smaller than that of the convex intralayer lens.

4. The semiconductor device according to claim 1, wherein a microlens is disposed on the transparent film.

5. The semiconductor device according to claim 4, wherein a color filter layer is disposed at a predetermined position between the transparent film and the microlens.

6. The semiconductor device according to claim 4, wherein the microlens is made of a transparent resin.

7. The semiconductor device according to claim 1, wherein the projection is in the shape of a column.

8. The semiconductor device according to claim 1, wherein the projection is located at the center of a pixel that is arranged in an array of pixels and the pixels each have the shape of a square or a hexagon.

* * * * *